United States Patent [19]

McLaughlin et al.

[11] Patent Number: 4,805,193

[45] Date of Patent: Feb. 14, 1989

[54] PROTECTION OF ENERGY INFORMATION IN SUB-BAND CODING

[75] Inventors: Michael McLaughlin, Palatine; Phillip D. Rasky, Glenview, both of Ill.

[73] Assignee: Motorola, Inc., Schaumburg, Ill.

[21] Appl. No.: 58,201

[22] Filed: Jun. 4, 1987

[51] Int. Cl.$^4$ .............................................. H04B 13/06
[52] U.S. Cl. ..................................... 375/27; 375/122; 381/29
[58] Field of Search ........................... 375/27, 30, 122; 370/89, 99, 102; 381/29, 30, 31, 32, 33, 34, 35

[56] References Cited

U.S. PATENT DOCUMENTS

| | | | |
|---|---|---|---|
| 4,017,693 | 4/1977 | Roche et al. | 379/361 |
| 4,048,443 | 9/1977 | Crochiere et al. | 179/1 SA |
| 4,149,039 | 4/1979 | Yuguchi et al. | 381/29 |
| 4,170,719 | 10/1979 | Fujimura | 381/29 |
| 4,216,354 | 8/1980 | Esteban et al. | 179/15.55 R |
| 4,374,304 | 2/1983 | Flanagan | 381/29 |
| 4,455,649 | 6/1984 | Esteban et al. | 370/80 |
| 4,464,782 | 8/1984 | Beraud et al. | 381/31 |
| 4,622,680 | 11/1986 | Zinser | 375/25 |
| 4,703,480 | 10/1987 | Westall et al. | 375/122 |

OTHER PUBLICATIONS

Aarskog, et al., "Real-Time Implementation of a 16 KBIT/s Speech Coder/Decoder Using Adaptive Sub-Band Coding Together with Time Domain Harmonic Scaling", *Nordic Seminar on Digital Land Mobile Radiocommunication*, (Feb. 5-7, 1985), pp. 27-34.
Ahlin, "Coding Methods for the Mobile Radio Channel", *Nordic Seminar on Digital Land Mobile Radiocommunication*, (Feb. 5-7, 1985), pp. 185-194.
Chien, "Memory Error Control: Beyond Parity", *IEEE Spectrum*, (Jul. 1973), pp. 18-23.
Chu, P., "Quadrature Mirror Filter Design for an Arbitrary Number of Equal Bandwidth Channels", *IEEE Trans. Acoust., Speech, Signal Processing*, vol. ASSP-31, pp. 203-218, Feb. 1985.
Kaltermeier, et al., "A Subband Coder for Digital Speech Transmission in the Digital Cellular Radio Telephone System CD900", *Nordic Seminar on Digital Land Mobile Radiocommunication*, (Feb. 5-7, 1985), pp. 279-285.
Kittel, "Channel Coding for Digital Public Land Mobile Networks", *Nordic Seminar on Digital Land Mobile Radiocommunication*, (Feb. 5-7, 1985), pp. 57-66.
Max, J., "Quantizing for Minimum Distortion", *IRE Trans. Inform. Theory*, pp. 7-12, Mar., 1960.
McLaughlin, "Comparison of Sub-Band Coding and Adaptive Predictive Coding for Land Mobile Radio", *Nordic Seminar on Digital Land Mobile Radiocommunication*, (Feb. 5-7, 1985), pp. 115-124.
McLaughlin et al., "Speech and Channel Coding for Digital Land-Mobile Radio", *IEEE Journal on Selected Areas in Communications*, vol. 6, No. 2, (Feb. 1988), pp. 332-345.
McNamara, John E., *Technical Aspects of Data Communications*, 2nd Ed., (Bedford, Mass.: Digital Press, 1982), pp. 110-112.

*Primary Examiner*—Robert L. Griffin
*Assistant Examiner*—Stephen Chin
*Attorney, Agent, or Firm*—Douglas A. Boehm; Charles L. Warren; Anthony J. Sarli, Jr.

[57] ABSTRACT

A digital communication system for transmission and reception of speech signals and utilizing sampling, filtering and sub-band coding techniques for reduction of the bit rate. The energy levels of each sub-band are determined with respect to the band having the maximum energy level. The energy level information is encoded and divided into protected and unprotected bits. Only the protected bits are used for the determination of the bit allocation of the sample information, but both protected and unprotected bits are utilized in reconstituting the original levels of the bands.

23 Claims, 4 Drawing Sheets

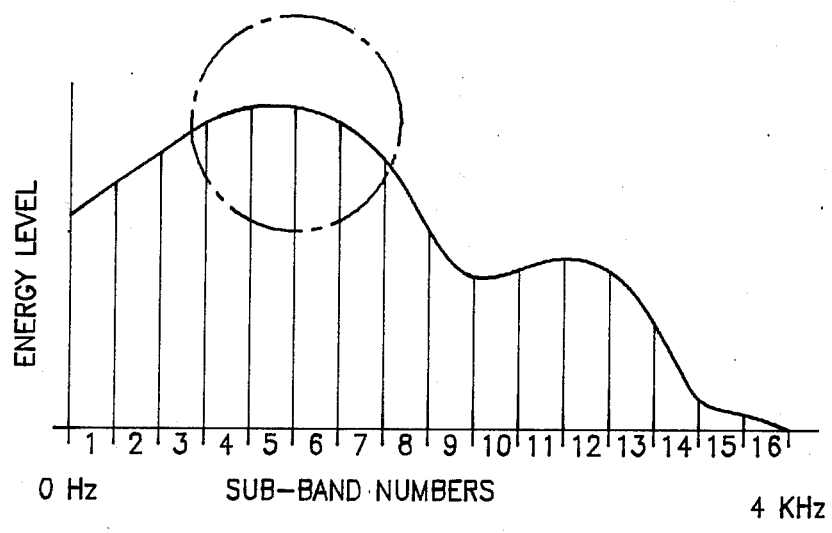
FIG. 1A
FIG. 1B
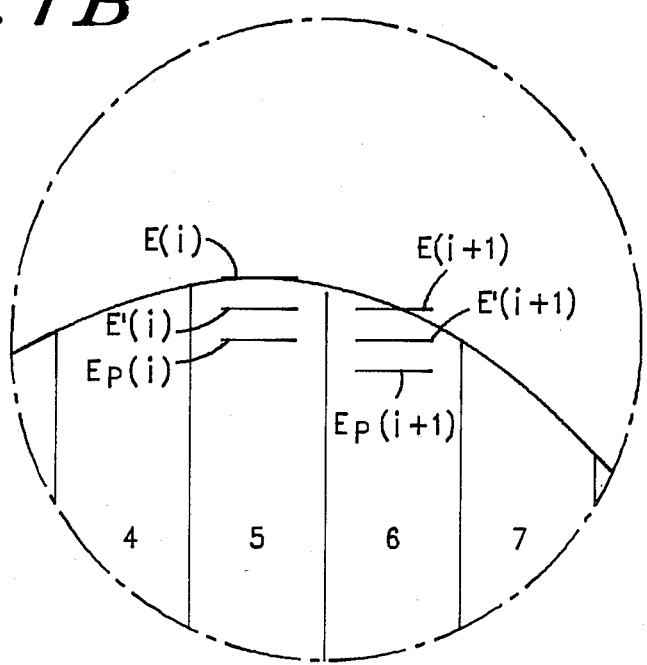

PROTECTION OF ENERGY INFORMATION IN SUB-BAND CODING

CROSS REFERENCE

This invention is related to U.S. patent application Ser. No. 07/058,202, assigned to the assignee of the present invention and filed as of even date herewith.

BACKGROUND OF THE INVENTION

The present invention is related to the field of digital communication, and particularly to a method and means for decreasing the susceptibility of a transmitted and received sub-band coded data stream to channel errors in mobile communication systems without increasing the required bit rate.

In such systems, channel errors often arise during transmission due to noise, interference and fading of the signal. Resulting errors in the data stream can cause severe deradation in the quality of the recovered speech signals. In the prior art there are many approaches to the transmission of digital speech signals. Many of these are based on the characteristics of speech; i.e., the statistics of the frequencies included and the energies in those frequencies. For example, it is known to utilize sub-band coding with energy quantization for decreasing the susceptibility of transmitted speech signals to errors due to noise during transmission. Most such systems operate by sending two main types of information, energy codes representing the energy in each band, and the sample codes for the band signals.

Since it is not efficient to use redundancy or other types of protective coding for all of the bits transmitted, various ways of determining the most vulnerable parts of the bit stream have been tried. Some systems provide error detection and protection on all of the bits used for transmitting energy codes, usually termed "side information". One such system was described by Kaltenmeier and Proegler in a paper given at the first Nordic Seminar on Digital Land Mobile Radiocommunications, 5-7 Feb., 1985, at Espoo, Finland. In this system approximately 3.5 kbps of error protection were used to provide error protection for all energy information as well as some band sample information. The side information was reduced by transmitting a small number of band energies, thus reducing speech quality at the receiver/decoder.

In another paper, given by Aarskog/Hergum at the seminar referenced above, vector quantization of the band energies is used to reduce the amount of side information which should be protected. Vector quantization, although it reduces the bit rate required for the side information, requires the storage of a large codebook, and requires additional computations to find the best match of all the codebook vectors. The net result is that an additional delay is introduced into the system, depending on the number of computations which are required. Such delays, as well as the added complexity, may not be acceptable in some applications.

Dynamic bit allocation has been determined to be advantageous, due to the need for more dynamic range for those bands with the most energy content. The general effect of errors on the band sample information bits themselves is to cause some roughness in the reproduced speech, but little loss of intelligibility. In the side (energy) information, however, which is used to provide information as to the bit allocations, a bit error can have a much greater effect. The error is very likely to be propagated over many bands, destroying the receiver's ability to reproduce the bit allocations of the bands accurately.

It is not particularly difficult to solve any of these problems if there are unlimited bits available for "error protection". For instance, it is known to protect all of the bits being transmitted by simply duplicating the transmission in some manner or by providing an elaborate redundancy code. Errors in received signals can also be detected and, possibly, corrected in one of many ways. The difficult part is to protect and, if necessary, correct the signal to a high degree of accuracy with a minimum number of added bits.

SUMMARY OF THE INVENTION

The object of the present invention is to minimize the loss of speech quality and intelligibility due to channel errors in digitized speech transmission.

A particular object is to maintain satisfactory speech quality without exceeding the allowed data rate.

These objects and others are accomplished in a digital communication system wherein the speech signal is first divided into a number of sub-bands which cover the entire desired spectrum. The energy contained in each band is determined and two 2-bit difference codes are computed for each band according to the energy contained in that band as compared to the other bands. The first 2-bit code is referred to as a delta code which is made up of the most-significant-bits of the energy difference. The delta codes alone are used by the receiver to determine how the sample bits were allocated from one band to the next. The remaining 2-bit code is termed the epsilon code and is used with the delta codes to provide a more accurate representation of the energy of the bands.

BRIEF DESCRIPTION OF THE DRAWING

FIG. 1A is a frequency spectrum chart illustrating sub-band coding.

FIG. 1B is an expansion of a portion of FIG. 1A.

DETAILED DESCRIPTION OF THE PREFERRED EMBODIMENT

Figure 2:
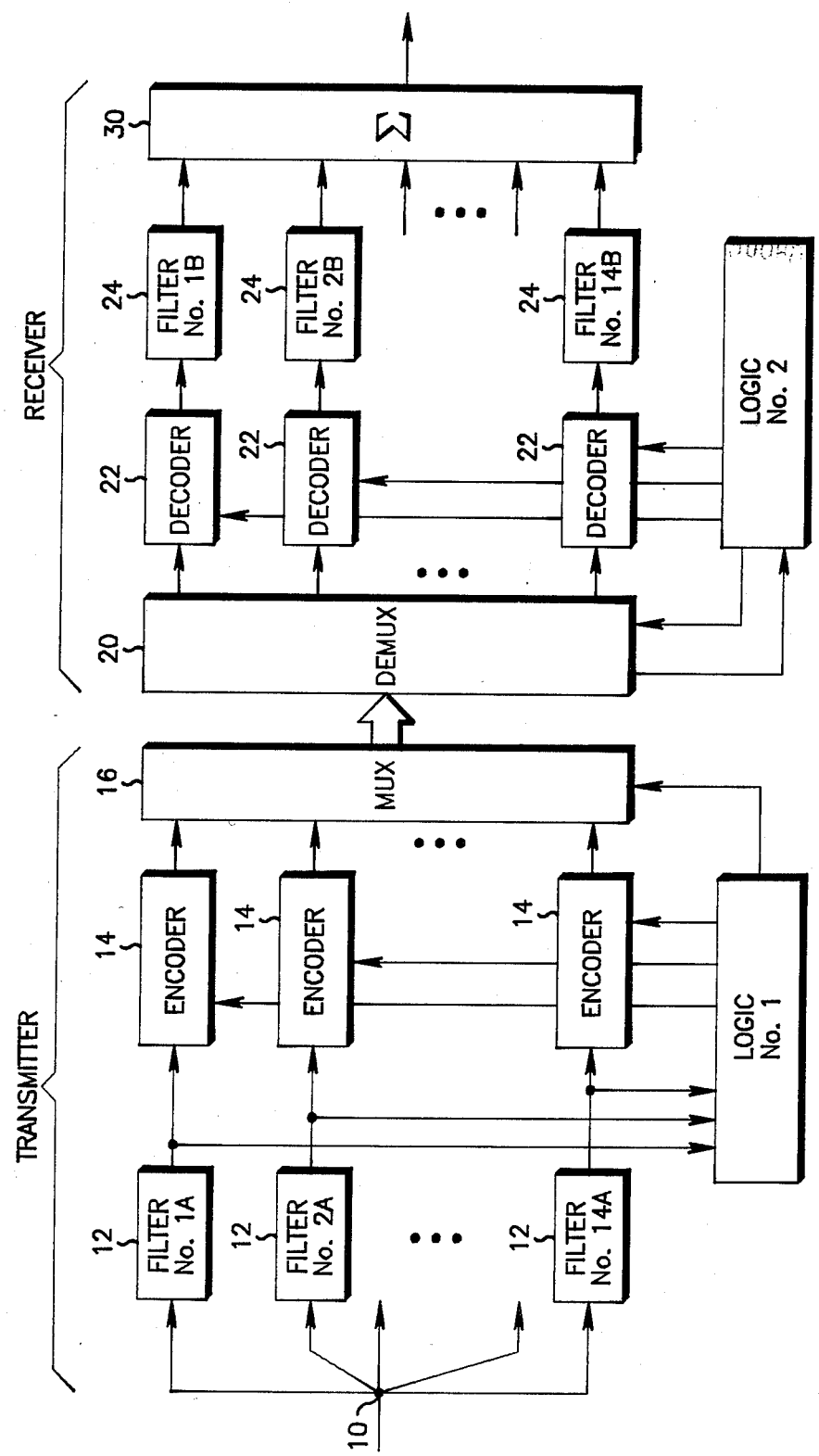
FIG. 2 is a block diagram of the sub-band coding system of the invention.

FIGS. 1A, 1B and 2 will be discussed together for best understanding. FIG. 1A is a linear frequency chart showing the typical instantaneous energy distribution of an audio or speech signal, divided into 250 Hz bands. FIG. 1B is an expanded view of the circled portion of FIG. 1A, showing added details. FIG. 2 is a block diagram of a sub-band speech coding system illustrating the invention. It should be noted that, while this discussion will refer to audio signals having certain frequency bands, no such limitation is meant to be implied and none should be inferred.

It is to be particularly noted that, while for simplicity the invention is described herein in the environment of sub-band coding, it is also applicable to multiple pulse coding (MPC), to channel vocoders, and to line spectral pair systems among others.

To describe the system of FIG. 2 in broad terms, an input terminal 10 receives a signal which, in this embodiment, is a speech signal. The received signal is coupled to a bank of contiguous bandpass filters 12. The structure or arrangement of the filters 12 is not particularly relevant to the present invention except that the passbands should overlap sufficiently to provide an essentially flat overall output response. In this exemplary system, the spectrum is divided into 16 bands, each approximately 250 Hz wide. The filtered bands are coupled to a logic block #1 and to individual encoders 14.

Logic Block #1 computes the energy of each of the bands based on the filtered band outputs. The energies are converted to energy codes which are input to the multiplexer 16. Based on the energies, the number of bits allocated to each of the encoders is determined. The energy information is also used to adjust the dynamic range of the encoders to match that of the filter outputs. The encoder outputs are then multiplexed in multiplexer (MUX) 16 for transmission.

In the receiver portion of the system, essentially the inverse steps are taken. The received and demodulated signals are demultiplexed in a demultiplexer (DEMUX) 20, decoded in multiple decoders 22 in cooperation with a Logic Block #2, filtered in another bank of bandpass filters 24, and summed at an output circuit 30 to recreate the original input signals.

One possible frequency spectrum of the signal at the input terminal 10 (FIG. 2) extends from 0 Hz to 4 kHz as shown in the exemplary curve of FIG. 1. In the preferred embodiment, the outputs of the two highest frequency bands are not coded, since speech signals at these frequencies normally contain very little energy. A spectrum of this type is usually a relatively smooth curve as shown in the example but this is not required for the invention.

Returning to FIG. 2, the output of each filter 10 is coupled to the logic No. 1 where it is separately quantized in known fashion, each sample resulting in a 16-bit number defining its energy level. In the present application, sampling is done at an 8 kHz rate, as indicated by Nyquist's Law (the Sampling Theorem). The bit stream is divided into frames of, for example, 24–30 msec length. Once per frame, an average value for the energy of each band is calculated. It would, of course, be desirable to represent the samples of each band as accurately as possible, but since the present system does not include enough bits for encoding all bits of the sample information, it is most critical to most accurately encode the samples of those bands having the greatest energy. This requires some form of allocation of the available bits according to band energy.

Therefore, the first necessary calculation is to locate the band having the most energy (max band), i.e., band 5 in the illustration. Then, according to a suitable algorithm, the energy codes of the other bands are determined, starting with the band just above the max band as compared with the max band. The differences between bands may be computed as described below, but other means of arriving at the relative values may be used if desired.

Here, band 5 has been determined to be the max band and its location and energy level will be coded with four and six bits respectively. Then, going up in frequency from band 5, the difference between the energies of band 5 and band 6 would be determined, then band 6 minus band 7, etc., until the difference value for band 14 was determined. Then, starting with band 4, difference values for bands 4, 3, 2 and 1 would be calculated. These would be given in four bits per band or 52 bits total (4×13 bands). It will be obvious that the difference codes can be used in the receiver to perform the inverse of the encoding process and recover the band energy values within the resolution of the four bit difference codes. More will be said with respect to these difference codes hereinbelow.

Since, as mentioned above, there are a limited number of bits available for transmitting the total information, preference is given to the samples of those bands having the most energy. In one application, only 19 bits are available to cover the 14 bands at each sample time. Therefore, some bands having very low energy levels are allocated zero bits, while the high energy bands may be allocated two or three bits each. It has been determined that the reproduced speech quality is best when the high energy bands are more accurately reproduced. The bit allo-cations are updated every frame.

Figure 3:
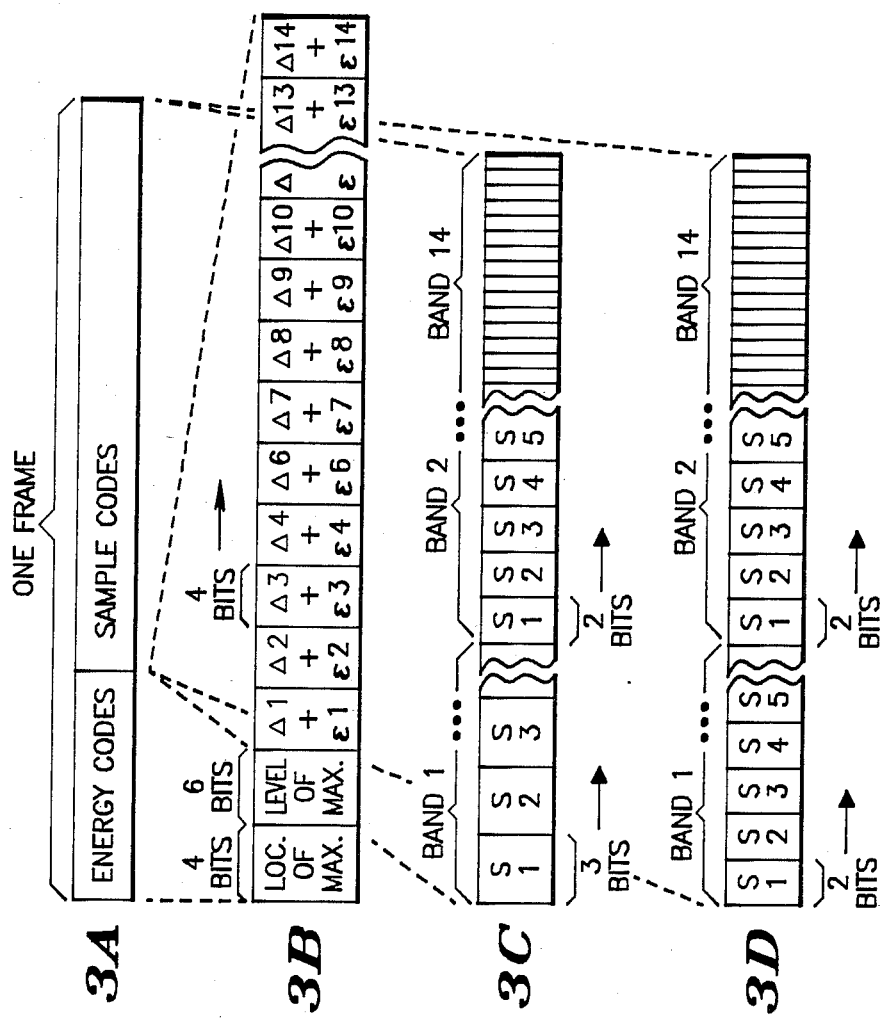
FIG. 3 is a diagram illustrating the signals transmitted and received in the system of FIG. 2.

The result of the calculations just described is a bit stream such as is illustrated in FIG. 3 which the receiver must be able to separate into codes for all of the speech information. The bits of the stream can be divided into two main portions, the energy codes (also termed "side information") and the sample codes. Other data bits such as error detection and correction are not shown here, but would be included in the transmission. In line A of FIG. 3, one frame is shown with the sample codes occupying the larger part (time) of the frame. Line 3A represents the signal as transmitted and received. In line 3B, the energy code portion of line 3A is expanded. The location of the max band (LOC. OF MAX) is given in four bits, the level of the max band (LEVEL OF MAX) takes up six bits, and the remainder is made up of four-bit energy codes, one for each remaining band whether there is any energy in it or not. This line also represents the transmitted and received signals.

Line C of FIG. 3 is an expansion of the sample code portion of line 3A and is intended to represent a signal which has not been corrupted by channel errors during the transmission. The samples of band 1 are indicated as being allocated three bits each, and the samples of band two, two bits.

Line 3D also is an expansion of the sample portion of line 3A and is intended to represent the same signal as in Line 3C, but which illustrates how the receiver/decoder responds to channel errors induced during the transmission of the energy code for band 1. Thus the bit allocation for band 1 has been calculated by the receiver to be two bits rather than three bits as coded by the transmitter. As a result, the sample codes for band 1 will be derived from only two bits of information, and the resultant speech signal will be garbled. Also, the unused bits of band 1 information will be assumed by the receiver to be intended for band 2 and will be so used, causing the sample values for band 2 to be garbled. It can be seen that such an error could be propagated through many bands. Therefore, it is in this portion of the frame information that channel errors can cause a major problem. In other words, since the sample codes are coarse to begin with, a channel error directly in that code information will merely add roughness to the speech quality. However, if the side information, as given in the energy codes, is affected by channel errors, the receiver will not be able to properly assign bit allocation to the received signal. This effect may be disastrously apparent to the listener.

As mentioned above, it is not always possible to protect all bits of the 4-bit energy codes. Therefore, according to this invention, each 4-bit energy code is divided into two 2-bits codes, only one of which will be protected. This new coding technique may be referred to as delta/epsilon coding, of which only the delta portion is used for calculating the bit allocation in both trasmitter and receiver.

As seen in FIG. 1B, E(i) is the actual average energy value of band (i), the max band. E(i+1) is the actual average value of the energy in the next higher band, etc. E'(i) is the energy value determined by the four-bit code, and the difference from E(i) is due to the quantization error. $E_p(i)$ is the "protected" energy for the max band which is allocated four bits for greatest accuracy. $E_p(i+1)$ is the "protected" energy for the band (i+1).

Figure 4:
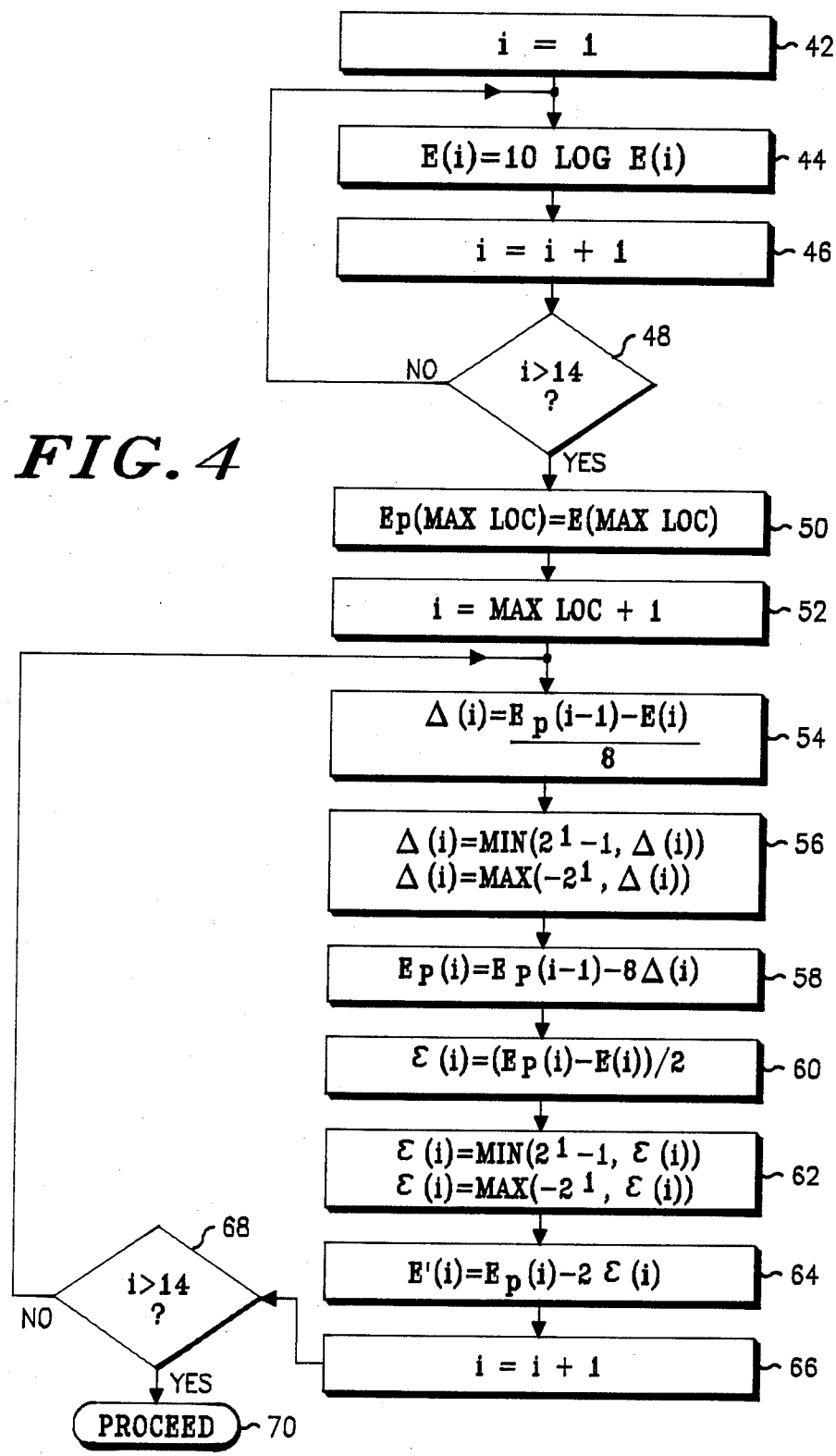
FIG. 4 is a flowchart illustrating the method of carrying out the invention.

FIG. 4 is a flowchart which illustrates the delta/epsilon coding technique of the present invention. Step 42 initializes the band counter i. In step 44 the energy level E(i) is converted to decibels, and this conversion is performed for each band via steps 46 and 48. In the preferred embodiment, the closest integer to the value of E(i) is used. Subsequently, in step 50 the location of the max band (MAX LOC) is determined, and it's energy is coded as Ep (MAX LOC). The calculations of the differences in energies begin with the band just higher in frequency than the max band in step 52. In the flowchart, the bands below the max band have not been considered, but would, of course, be calculated.

In step 54, a delta code $\Delta(i)$ is calculated as the difference between the energy of a band E(i) and the "protected" energy of the previous band Ep(i−1), wherein 8 is used to quantize the energy difference into 8 dB steps. This value is also rounded off to the nearest integer value in the preferred embodiment. In step 56, the delta code is restricted to the range corresponding to a 2-bit code; i.e., (−2,+1) using the MIN and MAX functions as shown. The protected value of the energy in dB for band (i) is computed in step 58 as the difference between the protected energy value for band (i<1) and the difference in energy represented by the delta code for band (i). In step 60, a second difference code, termed an epsilon code $\epsilon(i)$, is formed from the difference between the true energy E(i) and the protected energy Ep(i) value, quantized in 2 dB steps. In step 62, the epsilon code is also restricted to the values for a 2-bit code. In step 64, a refined energy value E'(i) is formed from the protected energy value of the band $E_p(i)$ minus two times the epsilon code for band (i). The band counter i is incremented in step 64 and tested in step 68. If all bands have been coded, control proceeds with step 70 to determine the bit allocations and perform the sample coding. Please note that band (i) in the flowchart of FIG. 4 is not necessarily the max band.

In FIG. 1B, the physical significance of the various energy values can be seen. The protected energy values, $E_p$, depend on only the delta codes and represent a coarse quantization of the energy value for use in bit allocation. The refined energy values E' use the delta codes plus the epsilon codes to give a more accurate representation of the actual band energy.

The advantage of using delta-epsilon coding is that the most important part of the energy information can be protected with, for example, only half the number of redundancy bits which would be required to protect all of the energy difference bits. Thus any error in an epsilon code will only affect the decoded energy for that band. The error will not be propagated to other bands.

While this technique can be used in any coding system which uses difference coding, a special advantage is obtained in sub-band coding. This is due to the fact that, if the most important information is protected, channel errors will have little effect on speech quality even over error-prone channels.

Thus there has been shown and described an improvement for a sub-band coding system, wherein the allocation of bits to the coding of sample information is done by separating the energy difference codes into delta and epsilon codes, protecting the delta codes, but utilizing the epsilon codes to reconstruct the energy levels in such a manner as to provide the best speech quality and intelligibility. Other variations and modifications of this improvement are possible and it is intended to cover all such as fall within the scope of the appended claims.

We claim:

1. A method of improving the quality of sub-band coded speech signals comprising at least the steps of:
   sampling the original speech signals;
   filtering the sampled speech signals into a plurality of frequency bands covering the desired spectrum;
   determining the energy contained in each band with respect to the other bands;
   providing a first code for specifying which band contains the maximum energy level;
   providing a second code for specifying the energy level of said maximum energy band;
   computing two difference codes, a delta code and an epsilon code, for each other band according to a predetermined algorithm for specifying the relative energy level of each said other band, a delta code representing the difference between the energy of a band and the protected energy of an adjacent band, and an epsilon code representing the difference between the energy of a band and the protected energy of the same band, and utilizing said delta codes for determining the bit allocation of the sample information;
   providing protection bits for each said delta code; and
   multiplexing said delta codes and said epsilon codes with other information into a frame of a data stream and transmitting said data stream.

2. The method according to claim 1, further including the steps of:
   receiving said data stream; demultiplexing said data stream; decoding said codes for reconstructing the original sampled signals at essentially the original energy levels;
   and filtering and combining the reconstructed signals to produce essentially the original speech signals.

3. The method according to claim 1, wherein said protected energy of a band is computed using the delta codes and not the epsilon codes for that band.

4. The method according to claim 1, wherein said computing step quantizes the the energy levels into quantization steps having a greater magnitude for said delta codes than said epsilon codes.

5. A sub-band coding system comprising:
   sampling means for sampling an input signal;
   filter means for separating said sampled input signal into a plurality of sub-band signals;
   encoder means for producing an encoded data stream corresponding to at least the energy levels of said sub-band signals, said encoded data stream including delta codes and epsilon codes, a delta code representing the difference between the actual energy level of a particular sub-band signal and that of a different sub-band signal, an epsilon code representing the difference between the quantized energy level as represented by said delta code of a particular sub-band signal and the actual energy level of that sub-band signal; and transmission means for processing said encoded data stream for transmission.

6. The sub-band coding system in accordance with claim 5, wherein said delta codes are protected by redundancy bits.

7. The sub-band coding system in accordance with claim 6, wherein said encoding means further produces sample codes used to represent the energy levels of said sub-band signals, and wherein said protected bits are utilized for determining the bit allocation of the sample codes.

8. The sub-band coding system in accordance with claim 7, further including means for decoding said encoded data stream to reconstruct said input signal.

9. The sub-band coding system in accordance with claim 8, wherein said decoding means includes means for determining the bit allocations of the sample codes from the protected delta codes.

10. The sub-band coding system in acordance with claim 8, wherein said delta codes quantize the energy levels into at least 5 dB steps.

11. A method of sub-band coding comprising steps of:

filtering an input signal into a plurality of frequency bands;

determining the actual energy level of the signal in each band;

determining the band which has the maximum actual energy level with respect to the other bands; and computing a delta code and an epsilon code for each band other than said maximum band, a delta code representing the difference between the actual energy level of a band and a coarse quantization of the energy level of another band, and an epsilon code representing the difference between the actual energy level of a band and a coarse quantization of the energy level of that band.

12. The method according to claim 11, wherein a first code is provided for specifying the location of said maximum energy band.

13. The method according to claim 11, wherein a second code is provided for specifying the actual energy level of said maximum energy band.

14. The method according to claim 11, wherein said delta code represents the difference between the actual energy level of a band and a coarse quantization of the energy level of an adjacent band.

15. The method according to claim 11, wherein said epsilon code represents the difference between the actual energy level of a band and the quantized energy level as represented by said delta code for that band.

16. The method according to claim 11, further comprising the step of sampling said input signal to provide sample code information.

17. The method according to claim 16, further comprising the step of utilizing said delta codes and not said epsilon codes for determining the bit allocation for said sample code information.

18. The method according to claim 11, further comprising the step of providing error protection for said delta codes.

19. The method according to claim 11, further comprising the step of multiplexing said delta codes and said epsilon codes with other information into a frame of data for transmission over a digital communications channel.

20. The method according to claim 19, wherein said delta codes occupy no more than two bits of information in a frame.

21. The method of according to claim 19, wherein said epsilon codes occupy no more than two bits of information in a frame.

22. The method according to claim 19, wherein the actual energy level of said maximum energy band is coded so as to occupy a greater number of bits of information in a frame than which said delta codes occupy.

23. The method according to claim 11, wherein said coarse quantization corresponds to at least 5 dB per quantized step.

* * * * *